United States Patent [19]
Chandler et al.

[11] Patent Number: 5,428,191
[45] Date of Patent: Jun. 27, 1995

[54] CONSISTENT GROUNDING TECHNIQUE BETWEEN COMPONENTS OF HIGH FREQUENCY SYSTEMS

[75] Inventors: Kirk R. Chandler, Garland; Leon Jinich, Plano, both of Tex.

[73] Assignee: Alcatel Network Systems, Inc., Richardson, Tex.

[21] Appl. No.: 275,136

[22] Filed: Jul. 14, 1994

[51] Int. Cl.⁶ .............................................. H05K 7/02
[52] U.S. Cl. ................... 174/261; 361/752; 361/799; 361/796; 439/65; 439/66
[58] Field of Search ................ 174/261; 361/752, 753, 361/758, 796, 799; 439/59, 65, 66, 82

[56] References Cited
U.S. PATENT DOCUMENTS 5,259,770  11/1993  Bates et al. ............................ 439/66
5,280,411   1/1994  Dirks et al. .......................... 361/707

*Primary Examiner*—Leo P. Picard
*Assistant Examiner*—L. Thomas
*Attorney, Agent, or Firm*—Vinson & Elkins

[57] ABSTRACT

A consistent, repeatable ground connection between a high frequency circuit board and a mating ground structure within a high frequency system is disclosed. The high frequency circuit board includes a dielectric layer located between a conductive backing and a microstrip transmission line. The conductive backing has a groove formed along one of its edges near the transmission line. An elastic, electrically conductive member is positioned within the groove so that it maintains electrical contact with the conductive backing and the mating ground structure. The invention reduces manufacturing costs by permitting less stringent manufacturing and machining tolerances, by eliminating the need for impedance matching between mating components, and by eliminating the need to utilize copper shims with adhesive backings between mating components. In addition, the invention maintains a consistent ground connection when the high frequency system is exposed to a range of operating temperatures.

19 Claims, 4 Drawing Sheets

CONSISTENT GROUNDING TECHNIQUE BETWEEN COMPONENTS OF HIGH FREQUENCY SYSTEMS

This invention relates generally to grounding techniques between components of high frequency systems, and is more particularly directed to providing consistent, repeatable ground connections between high frequency circuit boards with thick conductive backings and mating ground structures within a high frequency system.

BACKGROUND OF THE INVENTION

In the field of high frequency systems, such as those systems operating at radio frequency (RF) or higher, significant signal attenuation and power loss is attributable to ground discontinuities between the components of such systems. In such high frequency systems, signals propagate as a wave emanating from a transmission line. Ideally, the ground connection between two mating components in such a system occurs at a point near the transmission line. However, if a significant distance exists between the ground connection and the transmission line, an inductive impedance is introduced into the high frequency system at the connection point. This inductive impedance causes signal attenuation and degrades the electrical performance of the system.

Ground discontinuities in a high frequency system are often cause by gaps between two mating components which occur as a result of the manufacturing process used to construct the system. FIGS. 1a, 1b, and 2 illustrate typical ground discontinuities in two conventional high frequency systems.

FIGS. 1a and 1b depict a portion of a conventional high frequency system 10 at the connection of a high frequency circuit board 12 and a high frequency circuit board 14 both mounted on a chassis 16. Circuit board 12 is composed of a dielectric layer 18 located between a conductive backing 20 and a microstrip transmission line 22. Similarly, high frequency circuit board 14 is composed of a dielectric layer 24 located between a conductive backing 26 and a microstrip transmission line 28. Transmission line 22 and transmission line 28 are electrically connected by ribbon connector 30, as is conventional.

In conventional high frequency system 10, a gap 32 often exists between the mating surfaces of conductive backing 20 and conductive backing 26. Gap 32 is typically caused by a variety of manufacturing problems. For example, gap 32 is often caused by unacceptable manufacturing tolerances in coupling circuit board 12 and circuit board 14 to chassis 16. In addition, even if high frequency system 10 is constructed with acceptable manufacturing tolerances, gap 32 can also be caused by unacceptable machining tolerances on the mating surfaces of conductive backing 20 and conductive backing 26. For example, the surface of conductive backing 20 could be machined at an angle relative to the mating surface of conductive backing 26. As another example, microscopic surface imperfections on the mating surfaces of conductive backing 20 and conductive backing 26 can also create gap 32. Finally, even if high frequency system 10 is constructed with acceptable manufacturing and machining tolerances, gap 32 can also be created by the thermal expansion of high frequency system 10 when it is exposed to a range of operating temperatures. Gap 32 can also be created by the movement of conductive backing 20 relative to conductive backing 26 when high frequency system 10 is exposed to a range of operating temperatures and when conductive backing 20 and conductive backing 26 are made from materials having different coefficients of thermal expansion.

Although ribbon connector 30 provides direct electrical connection between microstrip transmission line 22 and microstrip transmission line 28, because of gap 32, the ground path 34 between high frequency circuit board 12 and high frequency circuit board 14 travels through conductive backing 20, through chassis 16, and finally through conductive backing 26. Therefore, because no direct ground connection exists near transmission line 22 and transmission line 28, an inductive impedance is introduced into high frequency system 10 at the connection point, and the overall electrical performance of high frequency system 10 is degraded.

FIG. 2 illustrates a ground discontinuity in a portion of a second, conventional high frequency system 40 at the connection between a high frequency circuit board 42, a coaxial cable connector 44, and a chassis 46. Circuit board 42 is composed of a dielectric layer 48 located between a conductive backing 50 and a microstrip transmission line 52. Conductive backing 50 is ideally mounted to a chassis leg 54 so that an edge 56 of conductive backing 50 is in electrical contact with an edge 58 of a chassis leg 60. Coaxial cable connector 44 is supported by and in electrical contact with chassis leg 60, as is well-known in the art. When connector 44 is supported by chassis leg 60 in this manner, lead 62 of connector 44 is in electrical contact with microstrip transmission line 52 of high frequency board 42.

Conventional high frequency system 40 is also vulnerable to the factors resulting in degraded electrical performance discussed for conventional high frequency system 10, namely unacceptable manufacturing tolerances, unacceptable machining tolerances, and thermal expansion problems. Because of these factors, a gap 64 is often present at the connection point, causing an indirect ground connection between high frequency circuit board 42 and chassis 46, as is illustrated by ground path 66. Therefore, because no ground connection exists near microstrip transmission line 52 and lead 62, an inductive impedance is introduced into high frequency system 40, and the overall electrical performance of high frequency system 40 is degraded.

These grounding problems illustrated by gaps 32 and 64 in conventional high frequency systems 10 and 40 have been addressed to some extent in the art. First, prior art high frequency systems have been designed and manufactured with very tight manufacturing and machining tolerances in an attempt to eliminate ground discontinuities caused by these gaps. However, such manufacturing results in lower manufacturing yields due to more stringent specifications. In addition, such manufacturing does not address the problem of gaps caused by thermal expansion. Furthermore, such manufacturing precludes the use of less precise, and less costly, manufacturing processes, such as the use of a sheet metal chassis.

Copper shims with adhesive backings have also been previously employed in an attempt to minimize signal attenuation caused by these gaps. For example, in FIG. 1a, a copper shim (not shown) could be adhesively coupled to conductive backing 20 of high frequency circuit board 12 in gap 32 so that it makes electrical contact with conductive backing 26 of high frequency circuit board 14 at a point near microstrip transmission line 22 and microstrip transmission line 28. The copper shim would thus eliminate the introduction of a significant inductive impedance into high frequency system 10. However, proper placement of such copper shims is labor intensive and increases manufacturing costs. These copper shims are also unreliable due to failure of their adhesive backings.

Finally, it is also known to introduce a capacitive impedance device into a high frequency system to compensate for the inductive impedance present due to a gap between mating ground structures. As illustrated in FIGS. 3a and 3b, a conductive plate 35 is coupled to ribbon connector 30 using a glue 36 to form such a capacitive impedance device. However, this "impedance matching technique" significantly increases manufacturing costs as it must be performed for each individual ground connection between components of a high frequency system.

While the above described problems have been illustrated for a single ground connection between two components of a high frequency system, virtually every such system requires multiple ground connections. As a result, a combination of these problems typically exists in a conventional high frequency system.

It is therefore an object of the present invention to provide a consistent grounding technique between components of a high frequency system.

It is a further object of the present invention to provide such a technique which allows the mating components of the system to be manufactured and assembled with less stringent manufacturing tolerances, thus decreasing manufacturing costs.

It is a further object of the present invention to provide such a technique which allows the mating components of the system to be machined with less stringent machining tolerances, thus decreasing manufacturing costs.

It is a further object of the present invention to provide such a technique which eliminates ground discontinuities caused by the relative movement of the mating components of the system when the system is exposed to a range of operating temperatures.

It is a further object of the present invention to provide such a technique which eliminates the need to utilize a capacitive impedance device to compensate for the inductive impedance introduced into the high frequency system due to ground discontinuities between the mating components of the system.

It is a further object of the present invention to provide such a technique which eliminates the need to utilize copper shims with adhesive backings between mating components of the system.

It is a further object of the present invention to provide such a technique which maintains a consistent ground connection between a high frequency circuit board and a chassis constructed of low cost materials, such as sheet metal.

Still other objects and advantages of the present invention will become apparent to those of ordinary skill in art having references to the following specification together with its drawings.

SUMMARY OF THE INVENTION

The present invention may be implemented into a high frequency system having a high frequency circuit board by providing a groove along one of the edges of the conductive backing of the circuit board near a microstrip transmission line. A conductive member is positioned within the groove so that it maintains electrical contact with the conductive backing and a mating ground structure to provide a consistent ground connection for the high frequency system.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b is a plan view of FIG. 1a;

FIG. 3b is a plan view of FIG. 3a;

FIG. 4b is a plan view of FIG. 4a;

DETAILED DESCRIPTION OF THE PREFERRED EMBODIMENTS

Figure 4A:
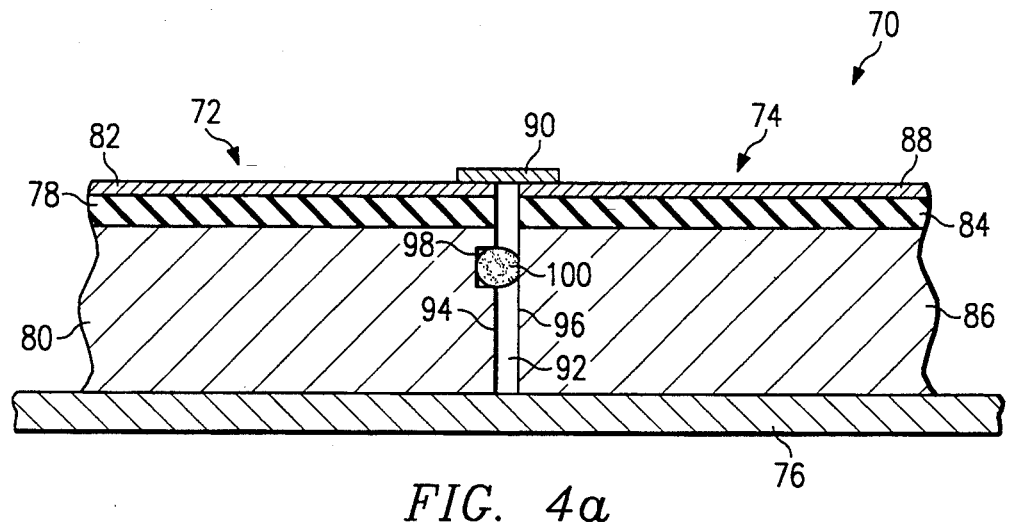
FIG. 4a is an enlarged, fragmentary, sectional view of the preferred grounding technique of the present invention employed between two high frequency circuit boards of a high frequency system.

The preferred embodiments of the present invention and its advantages are best understood by referring to FIGS. 4a–6 of the drawings, like numerals being used for like and corresponding parts of the various drawings. FIGS. 4a and 4b depict a portion of a high frequency system 70 at the connection of a high frequency circuit board 72 and a high frequency circuit board 74, both mounted on a chassis 76. High frequency system 70 typically operates within radio frequency range at frequencies of up to 20 GHz. Circuit board 72 is composed of a dielectric layer 78 located between a conductive backing 80 and a microstrip transmission line 82. Similarly, high frequency circuit board 74 is composed of a dielectric layer 84 located between a conductive backing 86 and a microstrip transmission line 88. Conductive backings 80 and 86 are preferably made from copper. Chassis 76 is preferably made from aluminum. Transmission line 82 and transmission line 88 are preferably electrically connected by ribbon connector 90, in the conventional manner.

Figure 1A:
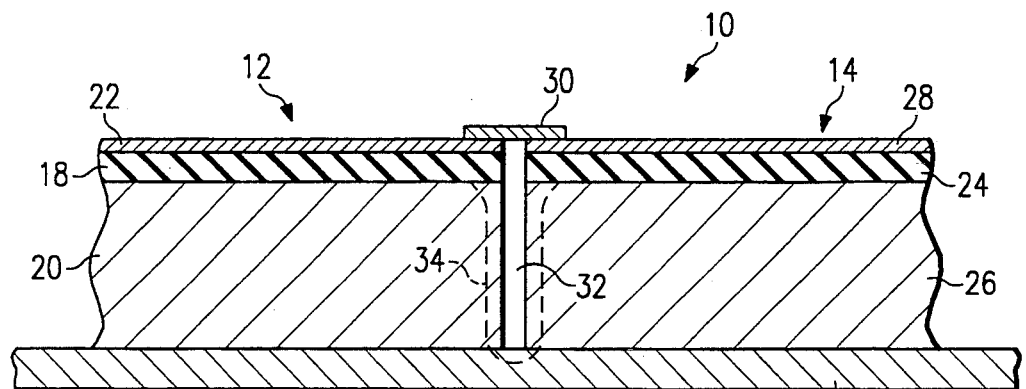
FIG. 1a is an enlarged, fragmentary, sectional view of a ground discontinuity between two high frequency circuit boards of a prior art high frequency system.
Figure 1B:
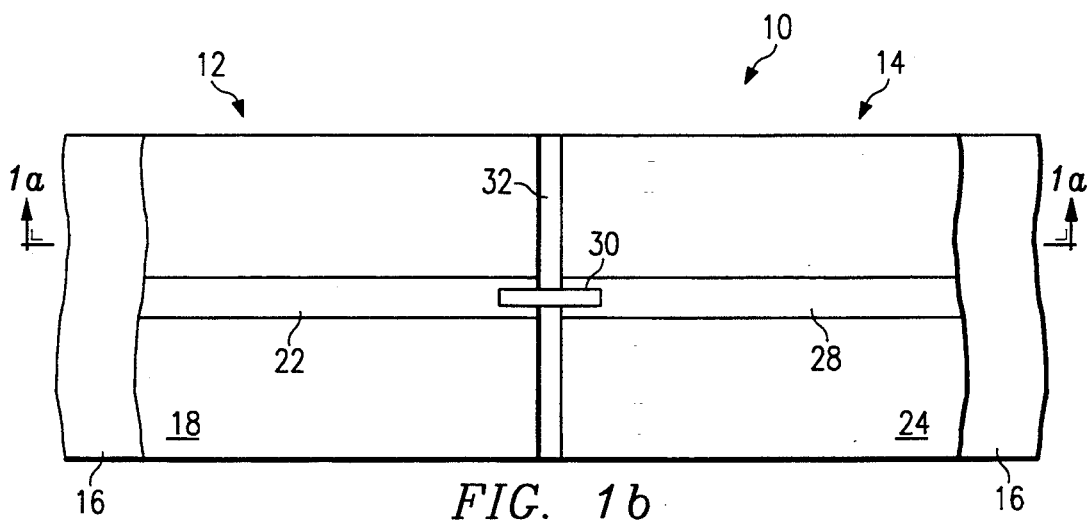

A gap 92 typically exists between an edge 94 of conductive backing 80 and an edge 96 of conductive backing 86. As described in connection with FIGS. 1a and 1b, gap 92 can be caused by the accumulation of manufacturing tolerances within high frequency system 70, the machining tolerances of edge 94, the machining tolerances of edge 96, and the thermal expansion of high frequency system 70 when it is exposed to a range of ambient operating temperatures (0–50 degrees Celsius). In addition, if conductive backings 80 and 86 were made from materials having different coefficients of thermal expansion, gap 92 could be caused by the movement of conductive backing 80 relative to conductive backing 86 due to exposure of high frequency system 70 to a range of operating temperatures.

Figure 4B:
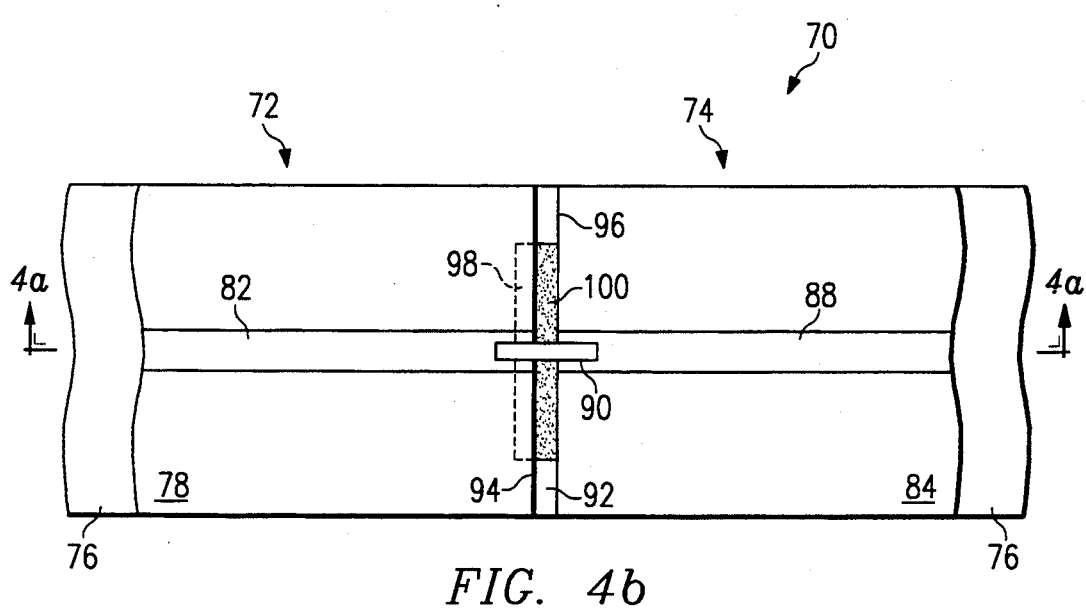

To eliminate the detrimental effects of gap 92 on the electrical performance of high frequency system 70, a groove 98 is formed in edge 94 of conductive backing 80 just below dielectric layer 78 before circuit board 72 is coupled to chassis 76. For high frequency systems operating at frequencies of 6 GHz to 20 GHz, the upper surface of groove 98 is preferably located 0.010 to 0.020 inches below the bottom surface of dielectric layer 78, as is shown in FIG. 4a. As is shown in FIG. 4b, the length of groove 98 is preferably at least five times the width of microstrip transmission line 82. Therefore, for example, if microstrip transmission line 82 was 0.045 inches wide, groove 98 would preferably be at least 0.225 inches long. Alternatively, groove 98 may run the entire width of conductive backing 80.

A conductive member 100 preferably made from an elastic material is disposed in groove 98 so that it maintains physical and electrical contact between conductive backing 80 and edge 96 of conductive backing 86 when circuit board 72 is coupled to chassis 76. A preferred example of conductive member 100 is a helical coil spring with an elliptical cross-section made from a beryllium/copper alloy. Alternatively, other materials such as a flexible silicone strand having an elliptical cross-section and a silver filling may be used. In the spring embodiment of conductive member 100, beryllium/copper alloy is selected for both its conductivity and also its spring properties. In the silicone strand embodiment of conductive member 100, silicone is chosen for its elasticity, and the silver filling is selected for its electrical conductivity.

The cross-sections of groove 98 and of conductive member 100, as shown in FIG. 4a, are preferably selected so that conductive member 100 is in compression when disposed in groove 98, thus preventing conductive member 100 from falling out of groove 98 before circuit board 72 is coupled to chassis 76. For example, in a helical coil spring embodiment of conductive member 100 with a wire diameter of 0.008 inches and with an elliptical cross-section having a major axis of 0.094 inches and a minor axis of 0.086 inches, the cross-section of groove 98 is preferably 0.088 inches high and 0.075 inches wide. As another example, in a helical coil spring embodiment of conductive member 100 with a wire diameter of 0.005 inches and with an elliptical cross-section having a major axis of 0.062 inches and a minor axis of 0.053 inches, the cross-section of groove 98 is preferably 0.058 inches high and 0.044 inches wide. Furthermore, after circuit board 72 is coupled to chassis 76, conductive member 100 is preferably in compression between conductive backing 80 and edge 96 of conductive backing 86 to ensure a consistent ground connection.

Figure 5A:
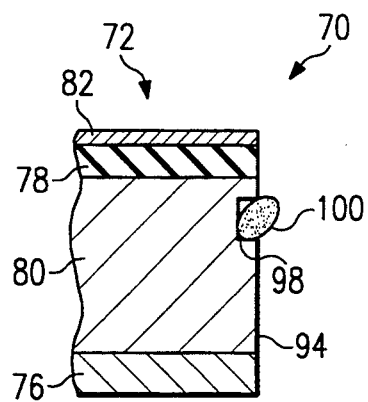
FIG. 5a is a fragmentary, detail view of FIG. 4a showing the preferred conductive member of the present invention in an non-compressed state.
Figure 5B:
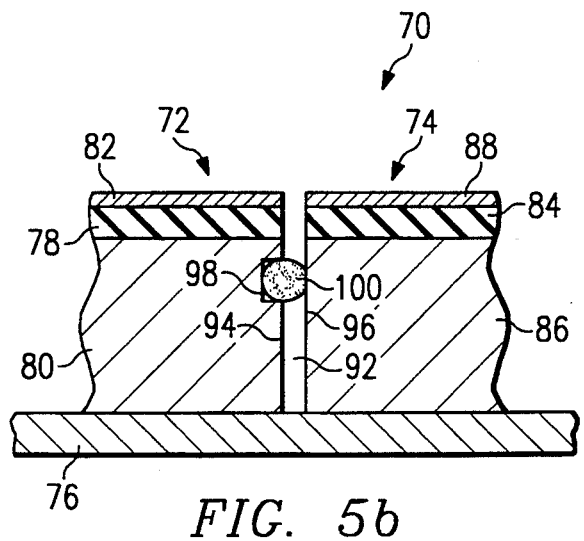
FIG. 5b is a fragmentary, detail view of FIG. 4a showing the preferred conductive member of the present invention a compressed state.

As is most clearly illustrated in FIGS. 5a and 5b, conductive member 100 preferably has an elliptical cross-section. An elliptical cross-section is preferred over a circular cross-section because an elliptical cross-section has better spring properties in a direction perpendicular to its longitudinal axis than does a circular cross-section. FIG. 5a shows conductive member 100 with an elliptical cross-section in an non-compressed state. FIG. 5b shows conductive member 100 with an elliptical cross-section in a compressed state within groove 98 and between conductive backing 80 and edge 96 of conductive backing 86. The improved spring properties of conductive member 100 in a direction perpendicular to its longitudinal axis, as shown in FIGS. 5a and 5b, gives it an improved ability to maintain physical and electrical contact between conductive backing 80 and edge 96 of conductive backing 86.

As shown in FIGS. 4a and 4b, conductive member 100 disposed in groove 98 provides a consistent, repeatable ground connection between circuit board 72 and circuit board 74 of high frequency system 70. Because groove 98 is formed just below dielectric layer 78, the ground connection is maintained near microstrip transmission line 82 and microstrip transmission line 88, and therefore a significant inductive impedance is not introduced into high frequency system 70. Because conductive member 100 is preferably made from an elastic material and is preferably disposed in compression within groove 98 and between conductive backing 80 and edge 96 of conductive backing 86, conductive member 100 can expand or contract to maintain electrical contact between conductive backing 80 and edge 96 over varying widths of gap 92 and over varying operating temperatures for high frequency system 70. Therefore, high frequency system 70 can be manufactured and assembled with less stringent manufacturing and machining tolerances, reducing manufacturing costs.

Figure 2:
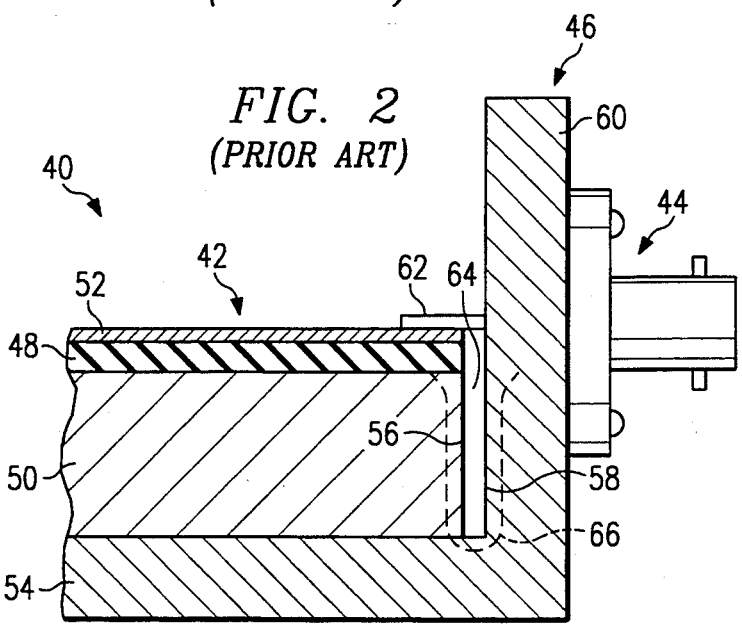
FIG. 2 is an enlarged, fragmentary, sectional view of a ground discontinuity between a high frequency circuit board and a chassis in electrical contact with a coaxial cable connector in a prior art high frequency system.
Figure 3A:
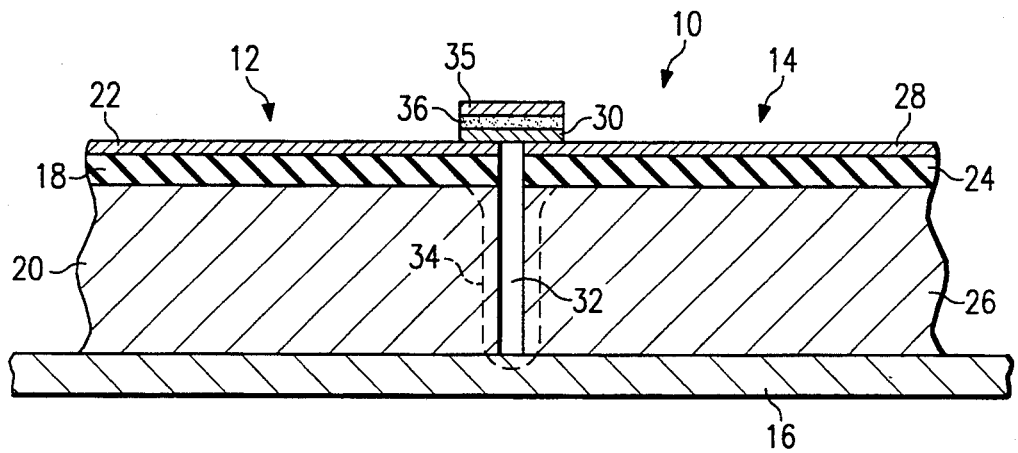
FIG. 3a is an enlarged, sectional view of a capacitive impedance device introduced into the prior art high frequency system of FIGS. 1a and 1b.
Figure 3B:
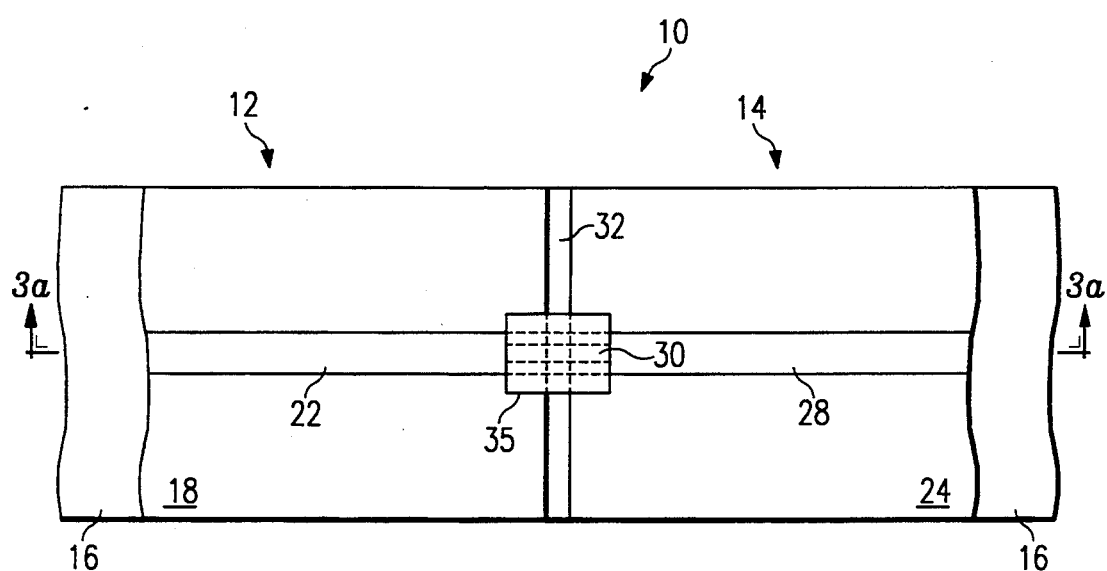
Figure 6:
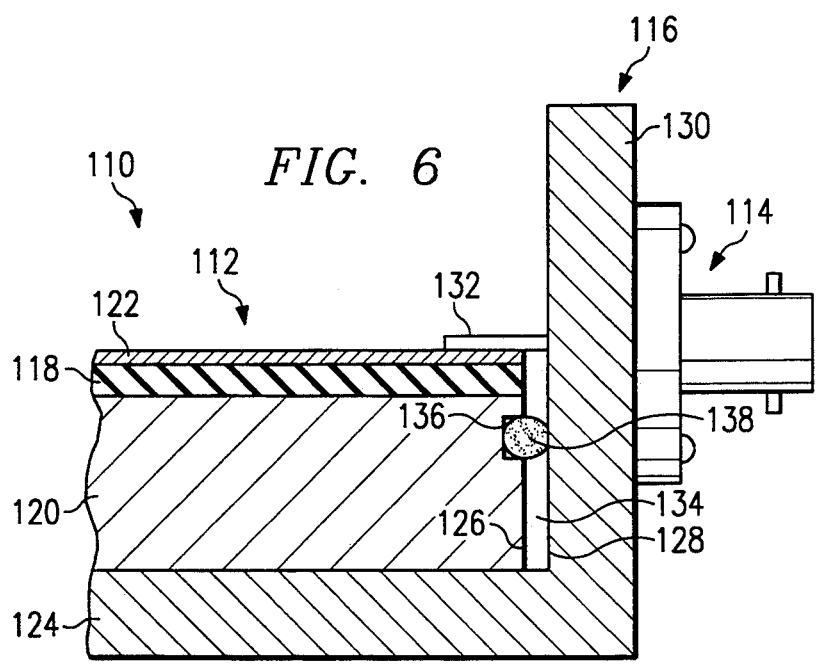
FIG. 6 is an enlarged, fragmentary, sectional view of the preferred grounding technique of the present invention employed between a high frequency circuit board and a chassis in electrical contact with a coaxial cable connector in a high frequency system.

FIG. 6 illustrates an alternate embodiment of the present invention. In high frequency system 110, a high frequency circuit board 112 and a coaxial cable connector 114 are supported on a chassis 116. High frequency system 110 typically operates within radio frequency range at frequencies of up to 20 GHz. High frequency circuit board 112 is composed of a dielectric layer 118 located between a conductive backing 120 and a microstrip transmission line 122. Conductive backing 120, and therefore high frequency circuit board 112, are mounted on a chassis leg 124 so that an edge 126 of conductive backing 120 is disposed near an edge 128 of a chassis leg 130. Coaxial cable connector 114 is in electrical contact with chassis leg 130, as is well known in the art. Conductive backing 120 is preferably made from copper, and chassis 116 is preferably made from aluminum. In addition, a lead 132 of coaxial cable connector 114 is in electrical contact with microstrip transmission line 122 of high frequency circuit board 112. A gap 134 typically exists between edge 126 of conductive backing 120 and edge 128 of chassis leg 130. Gap 134 is attributable to causes similar to those described in connection with gap 64 of FIG. 2.

A groove 136 is formed in conductive backing 120 just below dielectric layer 118 and near microstrip transmission line 122 before circuit board 112 is mounted on chassis leg 124. For high frequency systems operating at frequencies of 6 GHz to 20 GHz, the upper surface of groove 136 is preferably located 0.010 to 0.020 inches below the bottom surface of dielectric layer 118. A conductive member 138 is disposed in groove 136 so that it maintains physical and electrical contact between conductive backing 120 and edge 128 of chassis leg 130 when circuit board 112 is mounted on chassis leg 124. Groove 136 preferably has a geometry similar to groove 98 described in FIGS. 4a and 4b. Conductive member 138 preferably has a geometry and material properties similar to conductive member 100 described in FIGS. 4a and 4b. In addition, in a helical coil spring embodiment of conductive member 138 made from a beryllium/copper alloy, the spring is preferably tin-plated to prevent galvanic corrosion between the beryllium/copper alloy and the aluminum chassis leg 130. As with conductive member 100, conductive member 138 is preferably disposed in compression within groove 136 and between conductive backing 120 and edge 128 of chassis leg 130 for the same reasons described in connection with member 100 of FIGS. 4a and 4b.

Conductive member 138 disposed in groove 136 provides a consistent, repeatable ground connection between circuit board 112 and chassis leg 130. Because groove 136 is formed just below dielectric layer 118, the ground connection is maintained near microstrip transmission line 122 and lead 132, and therefore a significant inductive impedance is not introduced into high frequency system 110. Like conductive member 100 and groove 98 described in FIGS. 4a and 4b, conductive member 138 and groove 136 cooperate to maintain this consistent ground connection for a less stringent manufacturing tolerance for high frequency system 110, a less stringent machining tolerance for high frequency system 110, and when high frequency system 110 is exposed to a range of ambient operating temperatures (0–50 degrees Celsius). In addition, although conductive backing 120 and chassis 116 are preferably made from materials having different coefficients of thermal expansion, conductive member 138 can expand or contract to maintain a consistent ground connection despite relative movement between edge 126 of conductive backing 120 and edge 128 of chassis leg 130 when high frequency system 110 is exposed to a range of operating temperatures.

From the above, it may be appreciated that the preferred embodiments of the present invention provide consistent, repeatable ground connections between components of high frequency systems, The present invention reduces manufacturing costs for such ground connections by permitting less stringent manufacturing and machining tolerances, by eliminating the need for impedance matching between mating components, and by eliminating the need to utilize copper shims with adhesive backings to eliminate ground discontinuities between mating components of a high frequency system. In addition, the present invention does not suffer from the reliability problems of such copper shims, and it maintains a consistent ground connection over a range of operating temperatures despite relative movement between mating components in a high frequency system.

The present invention is illustrated herein by example, and various modifications may be made by a person of ordinary skill in the art. For example, numerous dimensions and/or geometries could be altered to accommodate a given configuration. As another example, various mating ground structures could be substituted while still achieving an equivalent function. Consequently, while the present invention has been described in detail, various substitutions, modifications, or alterations could be made to the description set forth above without departing from the invention which is defined by the following claims.

What is claimed is:

1. A high frequency system, comprising:
   a first high frequency circuit board, comprising:
   a dielectric layer having a first surface and a second surface;
   a microstrip transmission line disposed on said first surface of said dielectric layer; and
   a conductive backing disposed on said second surface of said dielectric layer, said conductive backing having a groove along an edge thereof, said groove disposed proximate said transmission line and separated therefrom by said dielectric layer;
   a mating ground structure; and
   a conductive member disposed in said groove and in electrical contact with said conductive backing and said mating ground structure.

2. The system of claim 1 wherein said mating ground structure comprises a second high frequency circuit board.

3. The system of claim 1 wherein said mating ground structure comprises a chassis supporting said first high frequency circuit board, said chassis having a wall in electrical contact with said conductive member.

4. The system of claim 1 wherein said conductive member comprises an elastic material.

5. The system of claim 1 wherein said conductive member comprises an elliptical cross-section.

6. The system of claim 1 wherein said conductive member comprises a helical coil spring having an elliptical cross-section.

7. The system of claim 1 wherein said conductive member comprises a silicone strand having an elliptical cross-section and a conductive filling.

8. The system of claim 1 wherein said conductive member comprises an elastic material disposed in compression between said conductive backing and said mating ground structure.

9. The system of claim 1 wherein said groove is disposed within 0.010 inches to 0.020 inches from said second surface of said dielectric layer.

10. The system of claim 1 wherein said groove has a length at least five times a width of said microstrip transmission line.

11. A method for manufacturing a system comprising a high frequency circuit board and a mating ground structure, said high frequency circuit board comprising a microstrip transmission line, a conductive backing, and a dielectric layer disposed between said transmission line and said conductive backing, said method comprising the steps of:
    forming a groove along an edge of said conductive backing proximate said transmission line and separated therefrom by said dielectric layer; and
    disposing an electrically conductive member in said groove so that said conductive member maintains electrical contact with said conductive backing and said mating ground structure.

12. The method of claim 11 and further comprising the step of coupling said conductive backing of said high frequency circuit board to a chassis so that said groove is disposed proximate said mating ground structure.

13. The method of claim 11 wherein said disposing step comprises disposing an elastic and electrically conductive member in said groove.

14. The method of claim 11 wherein said disposing step comprises disposing an electrically conductive member having an elliptical cross-section in said groove.

15. The method of claim 11 wherein said disposing step comprises disposing a helical coil spring having an elliptical cross-section in said groove.

16. The method of claim 11 wherein said disposing step comprises disposing a silicone strand having an elliptical cross-section and a conductive filling in said groove.

17. The method of claim 11 wherein said disposing step comprises disposing an elastic and electrically conductive member in compression between said conductive backing and said mating ground structure.

18. The method of claim 11 wherein said forming step comprises forming said groove within 0.010 to 0.020 inches from said dielectric layer.

19. The method of claim 11 wherein said forming step comprises forming said groove with a length at least five times a width of said microstrip transmission line.

* * * * *